SEMICONDUCTOR WAFER TRANSPORTING JIG

Filed Sept. 13, 1968 2 Sheets-Sheet 1

INVENTOR
ROBERT C. SHAMBELAN
BY M. Y. Epstein
ATTORNEY

Oct. 20, 1970 R. C. SHAMBELAN 3,534,862

SEMICONDUCTOR WAFER TRANSPORTING JIG

Filed Sept. 13, 1968 2 Sheets-Sheet 2

INVENTOR
ROBERT C. SHAMBELAN

BY M. Y. Epstein
ATTORNEY

United States Patent Office 3,534,862

Patented Oct. 20, 1970

3,534,862

SEMICONDUCTOR WAFER TRANSPORTING JIG

Robert C. Shambelan, Somerville, N.J., assignor to RCA Corporation, a corporation of Delaware Filed Sept. 13, 1968, Ser. No. 759,639
Int. Cl. A45c 11/00
U.S. Cl. 211—41 3 Claims

ABSTRACT OF THE DISCLOSURE

A semiconductor wafer carrying jig for transferring a plurality of wafers between operating stations and for simultaneously transferring the wafers to and from jigs at the various stations, comprising a trough-shaped member having a bottom, and oppositely disposed sides extending upwardly from the bottom. Each of the sides is provided with a plurality of upwardly extending grooves, each of the grooves in one side being in registry with one each of the grooves in the other side, thereby providing a plurality of pairs of grooves for receipt of the wafers. One side wall of each of the grooves diverges away from the other side wall of the grooves in a direction away from the bottom of the grooves.

BACKGROUND OF THE INVENTION

This invention relates to the fabrication of semiconductor devices.

In the fabrication of semiconductor devices, e.g., transistors, one practice is to simultaneously fabricate a plurality of identical semiconductor components on a thin and fragile circular disc, or wafer, of a semiconductor material, such as silicon. The wafer is thereafter broken apart into individual components, or pellets, which are mounted in suitable enclosures.

In the fabrication of the components on the wafer, the wafer is subjected to numerous processing procedures, such as various combinations of the steps of coating, etching, washing, and the like. The performance of different ones of these steps often involves the use of various jigs or wafer carriers. Because of the fragile nature of the wafers, the prior art practice has been to handle each of the wafers individually in the loading and unloading of the various jigs. This results in a great deal of handling of the wafers, which is expensive, and which leads to loss of product owing to scratching of the surfaces of the fragile wafers and contamination of the wafers by the various handling means.

SUMMARY OF THE INVENTION

A semiconductor wafer carrying jig is provided comprising a trough-shaped member having a bottom, and oppositely disposed sides extending upwardly from the bottom. Each of the sides is provided with a plurality of grooves extending upwardly from the bottom of the member, each groove in one side being associated with a different one of the grooves in the other side, thereby providing a plurality of pairs of grooves for receipt, one to a pair of grooves, of a plurality of wafers. At least one wall surface of each of the grooves tapers away from the other wall of the groove in a direction away from the bottom of the groove.

DESCRIPTION OF A PREFERRED EMBODIMENT

Figures 1, 2, 3, 4, 5:
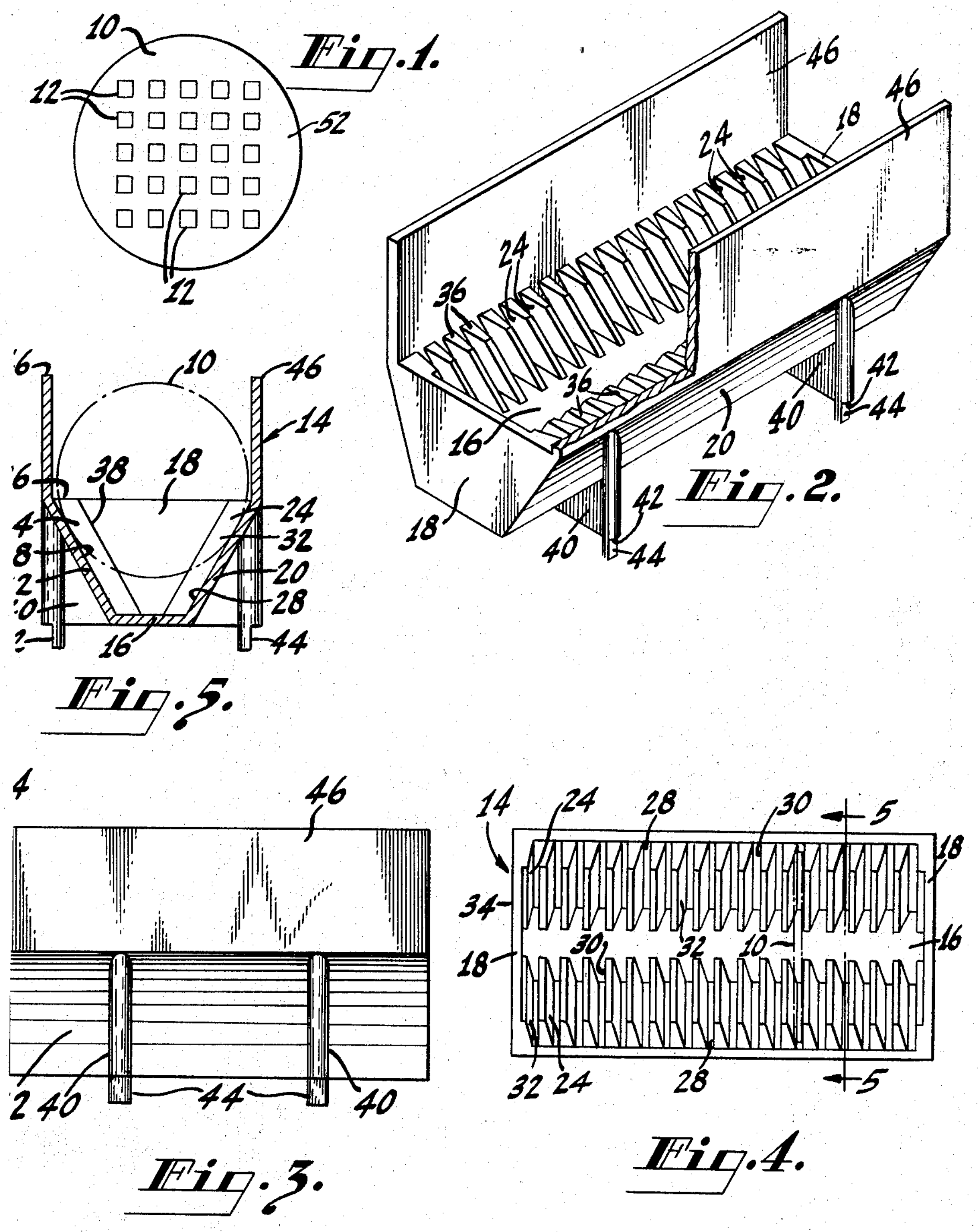
FIG. 1 is a plan view of a semiconductor wafer.
FIG. 2 is a view in perspective, partly broken away, of a jig for transporting a plurality of semiconductor wafers.
FIG. 3 is a side elevation of the jig shown in FIG. 2.
FIG. 4 is a plan view of the jig.
FIG. 5 is a section taken along line 5—5 of FIG. 4.

With reference to FIG. 1, a wafer 10 is shown comprising a thin, e.g., 6 mils thick, circular disc of a semiconductor material, e.g., silicon. The wafer 10 comprises a plurality of spaced semiconductor device components 12 arranged in rows and columns on the wafer. The processes for fabricating the wafer 10 with the components thereon are known.

A jig for transporting a plurality of wafers 10 between operating stations where various ones of the wafer processing steps are performed, and for simultaneously transferring the wafers to jigs in which the processes on the wafers are performed, is shown in FIGS. 2, 3, 4, and 5.

The jig 14 comprises an elongated, generally trough-shaped member having a bottom 16, two end plates 18, and two side walls 20 and 22 extending upwardly from the bottom 16.

Each side wall 20 and 22 is provided with a plurality of upwardly extending grooves 24 having a bottom 28, and side walls 30 and 32. The side walls 30 face one end 34 (see FIG. 4) of the jig and are parallel to a plane transverse to the longitudinal axis of the jig. In one embodiment, wherein the end plates 18 are perpendicular to the longitudinal axis of the jig, the planes of the side walls 30 are likewise perpendicular to the longitudinal axis.

The other side walls 32 of each of the grooves 24 diverge away from the side walls 30 in a direction away from the bottom 28 of the grooves.

The purpose of the groove side wall arrangement is described below.

Each groove 24 in one side wall is associated with a groove in the other side wall to provide a pair of grooves for receipt of a wafer 10 (shown in dashed lines in FIGS. 4 and 5). Although not necessary, the grooves of each pair lie in a plane perpendicular to the longitudinal axis of the jig.

Preferably, the jig side walls 20 and 22 taper away from one another in a direction upwardly from the bottom 16 of the jig (FIG. 5). This allows circular wafers of different diameters to be carried by the jig 14, the wafers sitting higher or lower in the jig depending upon the diameters of the wafers. As shown, the wafers extend at least partly above the upper ends 36 of the walls defining the grooves, for a reason described below.

Figure 6:
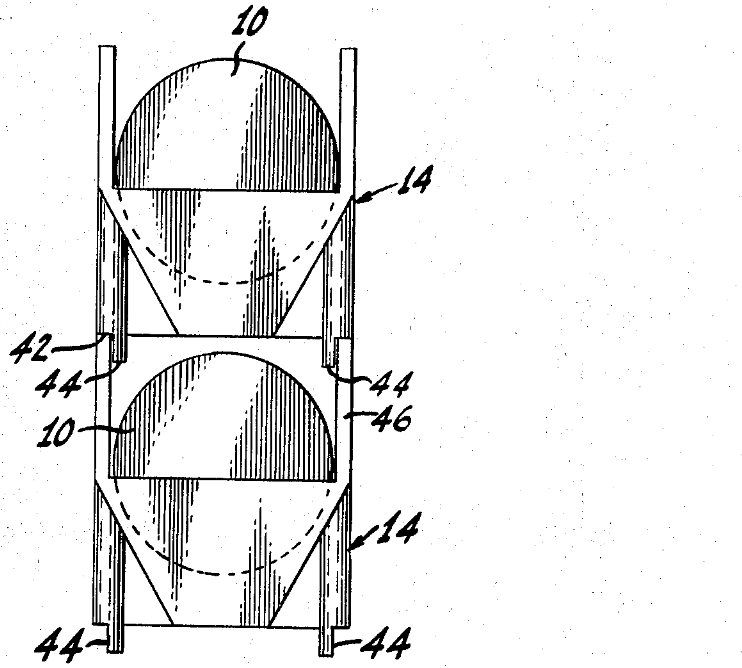
FIG. 6 is a front elevation showing two jigs stacked one on top of the other.

The jig 14 is provided with four legs (FIGS. 2 and 5) each of which includes a horizontal ledge 42, and a downwardly extending projection 44. Two plates 46 are provided extending upwardly from the side walls 20 and 22 of the jig. A pluralty of jigs 14 can thus be securely stacked one on top of the other, as shown in FIG. 6, by inserting the downwardly extending leg projections 44 of the upper jig between the upwardly extending plates 46 of the lower jig. The horizontal ledges 42 rest on the upper surfaces of the plates 44.

Generally, the wafers 10 (FIG. 1) have one flat surface 52 which is especially susceptible to damage from the slightest scratching thereof. The jig 14 is designed to minimize scratching of the wafer surface 52 during loading and unloading of the wafers into and out of the jig, and during transport of the loaded jig.

Figure 7:
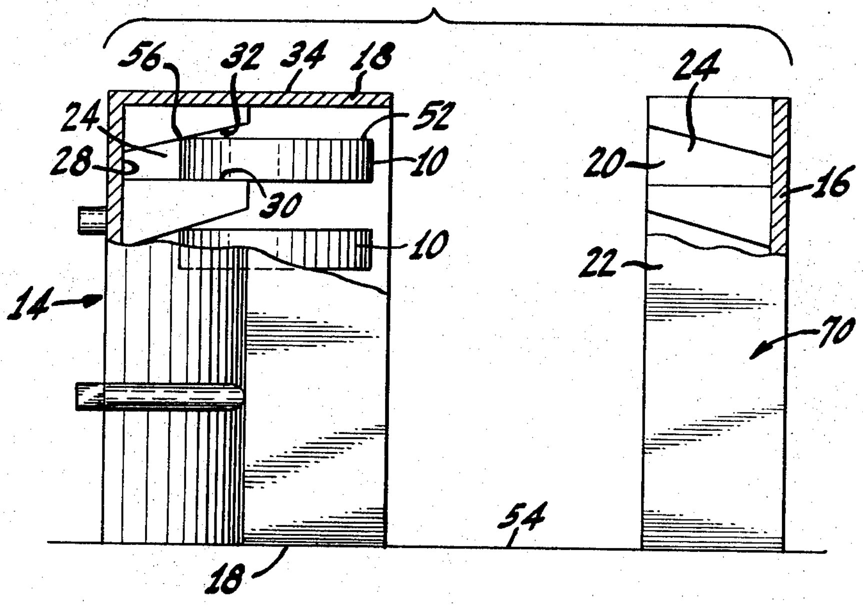
FIG. 7 is a side elevation, partly broken away illustrating the use of the jig, drawn to a larger scale, in the transfer of wafers to another jig.

During loading or unloading of the jig 14, as described hereinafter, the jig 14 is turned on its end, as shown in FIG. 7, with one end plate 18 resting on a flat surface 54, and the end 34 of the jig up. In this position, the side walls 30 of the grooves are horizontal, and the wafers 10 rest on the walls 30 in generally horizontal planes. By disposing the wafers 10 in the jig such that the "delicate" surface 52 of the wafer faces the end 34 of the jig, the only contact, if any, between the wafer surface 52 and the groove wall surface 32 is at the edge 56 of the disc-like wafer. Thus, during transfer of the wafers into and out of the jig, which involves sliding the wafers along the walls 30 of the grooves 24, as described below, little or no scraping of the wafer surfaces 52 against the slot walls occurs. This greatly minimizes damage of the wafers.

During transport of the jig 14 in a horizontal orientation, the tapered wall surface 32 engages only the wafer edge 56, thus preventing scraping of the wafer surface 52.

In the use of the jig 14 to simultaneously load or unload a plurality of wafers into or out of jigs at various operating stations, the jig 14 is disposed in end-up relation adjacent to another jig 70, as shown in FIG. 7. The jig 70 is similar to the jig 14 in that it is provided with a bottom 16, sides 20 and 22, and a groove 24 arrangement identical to that of the jig 14. The jigs 14 and 70 are moved towards one another along the surface 54 (to provide horizontal registration of the grooves of each jig) to insert the portions of the wafers extending outwardly of the grooves 24 in one jig (the jig 14, as illutsrated) into the corresponding grooves of the other jig. When the wafers have been at least partially seated within the grooves of the other jig, the two jigs 14 and 70 are rotated together to cause the wafers 10 to slide out of grooves 24 in the one jig and into the grooves in the other jig.

What is claimed is:

1. A jig for carrying thin, flat semiconductor wafers comprising:

a trough having a bottom and a pair of opposed side walls each extending upwardly from said bottom;

each of said walls having an array of grooves therein which extend upwardly from said bottom;

each groove in one side wall being disposed opposite a groove in the other side wall providing a pair of grooves for receipt of a wafer; and all of the side walls of the grooves facing one end of said trough being substantially perpendicular to the longitudinal axis of said trough, all of the other side walls of said grooves diverging away from said first mentioned groove side walls in a direction away from the bottom of said grooves, and the two of said other side walls of each pair of grooves beng non-parallel, thereby preventing parallel disposition of said wafer with said two other side walls.

2. A jig as in claim 1 wherein said trough side walls mutually diverge in a direction away from the bottom of said trough, whereby to accommodate different diameter wafers.

3. A jig as in claim 1 including means by which said jig can be stood on the other of said trough ends for disposing said first mentioned side walls of said grooves in horizontal disposition.

References Cited

UNITED STATES PATENTS

| | | | |
|---|---|---|---|
| 1,407,614 | 2/1922 | Wicks | 220—20 X |
| 1,954,224 | 4/1934 | Piker | 220—22 |
| 2,081,078 | 5/1937 | Watson | 220—22 X |
| 2,732,967 | 1/1956 | Metcalf | 220—97 X |
| 2,900,074 | 8/1959 | Windman | 206—73 X |
| 3,172,562 | 3/1965 | Nascher, et al. | 220—97 |

JOSEPH R. LECLAIR, Primary Examiner

J. R. GARRETT, Assistant Examiner

U.S. Cl. X.R.

206—1; 220—97